United States Patent [19]

Presser

[11] 3,848,201

[45] Nov. 12, 1974

[54] TURNABLE SOLID STATE LOCAL OSCILLATOR

[75] Inventor: Adolph Presser, Kendall Park, N.J.

[73] Assignee: The United States of America as represented by the Secretary of the Navy, Washington, D.C.

[22] Filed: Oct. 18, 1971

[21] Appl. No.: 189,822

[52] U.S. Cl. .................. 331/76, 331/96, 331/117 D

[51] Int. Cl. .............................................. H03b 3/04

[58] Field of Search ........... 331/117 D, 96, 97, 101, 331/76

[56] References Cited

UNITED STATES PATENTS

| | | | |
|---|---|---|---|
| 3,315,180 | 4/1967 | Racy | 331/117 D |
| 3,343,105 | 9/1967 | Van der Pauw | 331/117 D |
| 3,393,378 | 7/1968 | Bene et al. | 331/117 D |
| 3,576,499 | 4/1971 | Axford et al. | 331/117 D |
| 3,577,100 | 5/1971 | Askew et al. | 331/117 D |

*Primary Examiner*—Richard A. Farley
*Assistant Examiner*—J. M. Potenza
*Attorney, Agent, or Firm*—R. S. Sciascia; G. J. Rubens; T. M. Phillips

[57] ABSTRACT

A wide band single control tunable power source consisting of a transistor oscillator driving a single stage high order step recovery diode multiplier. The base and emitter of the transistor are each tuned by mechanically tunable, temperature compensated coaxial resonators.

4 Claims, 1 Drawing Figure

PATENTED NOV 12 1974 3,848,201
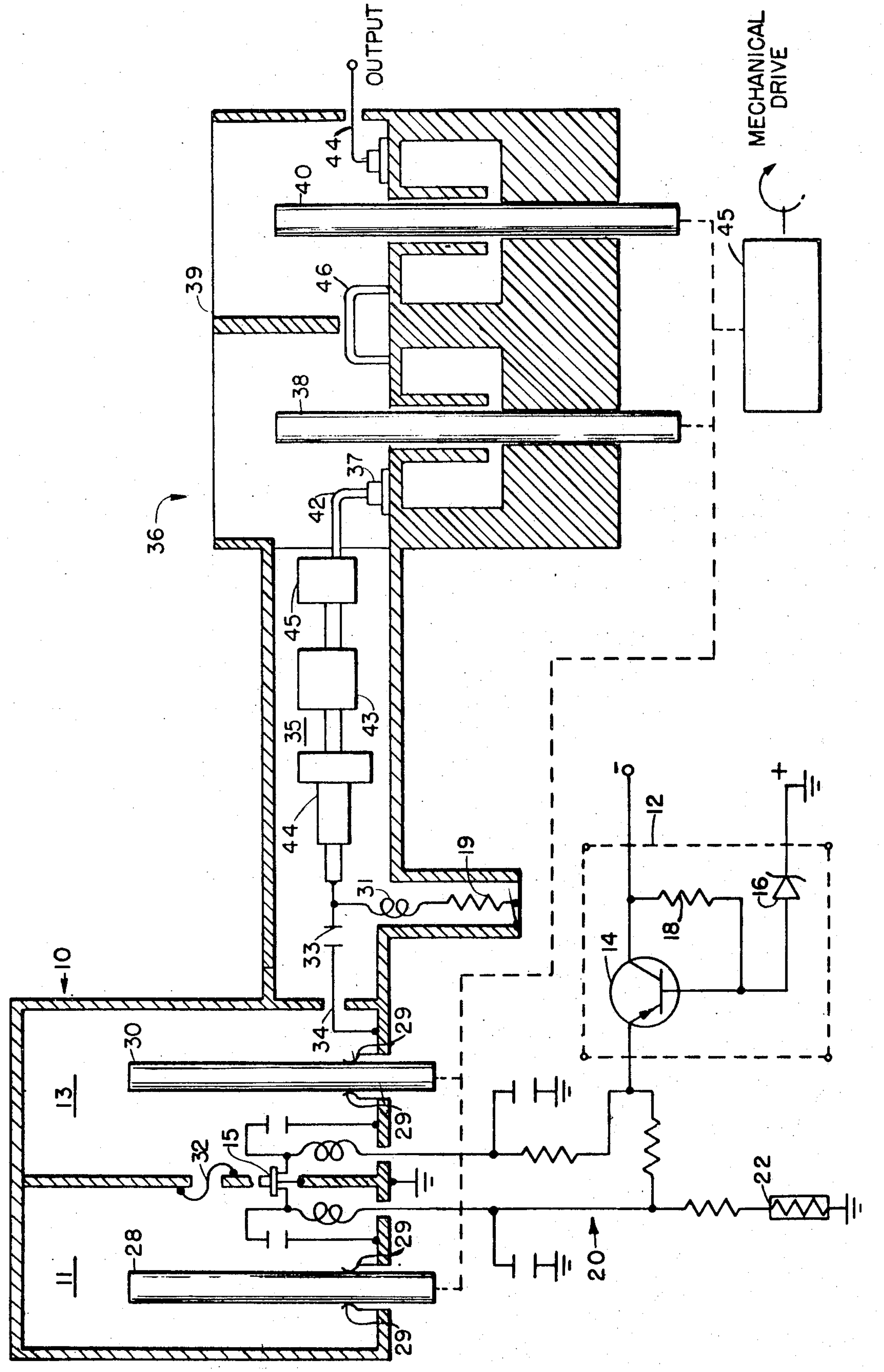

TURNABLE SOLID STATE LOCAL OSCILLATOR

BACKGROUND OF THE INVENTION

Step recovery diodes are known to be efficient harmonic power generators of high multiplication order without use of idler circuits that are necessary in conventional varactor diode multiplier. Narrow band applications of step recovery diodes with multiplication factors up to twenty are well known in the prior art.

SUMMARY OF THE INVENTION

The present invention relates to a tunable power source utilizing a step recovery diode multiplier and more particularly to a wide band tunable power source utilizing a step recovery diode multiplier. The present invention provides a wide band single control tunable power source consisting of a transistor oscillator driving a single stage high order step recovery diode multiplier. The transistor oscillator employs an Si-npn transistor in a grounded collector configuration. The base and emitter of the transistor are each tuned by mechanically tunable, temperature compensated coaxial resonators. A feedback loop is provided between resonators to assure sustained oscillations over the whole tuning range of the oscillator. The multiplier section consists of a step recovery diode inserted in the input loop of a two section,constant Q, wide band coaxial filter mechanically tunable over the n-th harmonic frequency range of the driver oscillator.

OBJECTS OF THE INVENTION

An object of the invention is to provide a wide band tunable power source.

Other objects and many of the attendant advantages of this invention will be readily appreciated as the same becomes better understood by reference to the following detailed description when considered in connection with the accompanying drawings.

Referring to the drawings wherein there is shown a transistor oscillator 10 having a base cavity 11 and an emitter cavity 13. Transistor 15 is supplied by a suitable DC voltage from a series type voltage regulator 12. Regulator 12 employs a transistor 14 having a collector-base reference voltage established by zener diode 16 and resistor 18. The base bias circuit 20 is stabilized by means of a silicon resistor 22 that reduces frequency and amplitude changes due to temperature variations. Resonator cavities 11 and 13 are temperature compensated by making the sliding center conductors 28 and 30 out of Kovar and the outer conductors 29 out of brass.

A feedback loop 32 between resonators 11 and 13 assures sustained oscillation over the required tuning range. The output from oscillator 10 is loop coupled by means of a conductor 34 and a bias network from the emitter cavity 13 to step recovery diode multiplier 36.

The bias network consists of a dc-blocking capacitor 33, rf-choke 31 and bias resistor 19. Step recovery diode multiplier 36 consists of a matching impedance section 35, step recovery diode 37 and output filter 39.

Output filter 39 is a two section mechanically tunable coaxial band-pass filter operating in the TEM mode and is coupled to oscillator 10 by means of an impedance matching circuit 35 consisting of a two step quarter-wave transmission line transformer 44 and matching fillers 43 and 45.

Tuning is accomplished by sliding center conductors 38 and 40 along the short circuiting section of the resonators. This may be accomplished by any suitable mechanical drive means 45 with mechanical coupling of the tuning of both oscillator 10 and filter 39.

By way of example, a 2N3866 transistor may be employed as transistor 15 in oscillator 10 and step recovery diode 37 may be a MA 4749 diode. In order to match the 50 ohm impedance of driver oscillator 10 to the approximately 5 ohm impedance of step recovery diode 37 over an input frequency band from 1.0 GHz to 1.57 GHz, a 60% bandwidth transmission line transformer centered at 1.3 GHz was used. Transformer 44 is followed by two identical sections varying impedance low pass filter 43 with a 5 ohm terminating impedance 45.

Obviously many modifications and variations of the present invention are possible in the light of the above teachings. It is therefore to be understood that within the scope of the appended claims the invention may be practiced otherwise than as specifically described.

What is claimed is:

1. In a wide band tunable power supply the combination comprising:

a. a transistor oscillator, b. a two section constant Q, wide band coaxial filter tunable over the n-th harmonic frequency range of said oscillator, c. a step recovery diode connected in series in the input loop of said coaxial filter, d. impedance matching network means coupling the output of said transistor oscillator to said input loop of said coaxial filter.

2. The tunable power supply of claim 1 wherein said transistor oscillator includes an Si-npn transistor in grounded configuration.

3. The tunable power supply of claim 2 wherein the base and emitter of said transistor are each tuned by mechanically tunable temperature compensated coaxial resonators.

4. The tunable power supply of claim 3 wherein a feedback loop is connected between the base resonator and the emitter resonator for sustaining oscillations over the tuning range of the oscillator.

* * * * *